(12) United States Patent
Lai et al.

(10) Patent No.: US 10,334,727 B2
(45) Date of Patent: Jun. 25, 2019

(54) ELECTRONIC APPARATUS, AND CIRCUIT BOARD AND CONTROL DEVICE THEREOF

(71) Applicant: REALTEK SEMICONDUCTOR CORP., Hsin-Chu (TW)

(72) Inventors: Chao-Min Lai, Hsinchu (TW); Shou-Te Yen, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 15/957,246

(22) Filed: Apr. 19, 2018

(65) Prior Publication Data
US 2018/0343739 A1  Nov. 29, 2018

(30) Foreign Application Priority Data
May 26, 2017  (TW) ............................. 106117609 A

(51) Int. Cl.
*H05K 1/00* (2006.01)
*H05K 1/02* (2006.01)
(Continued)

(52) U.S. Cl.
CPC ........... *H05K 1/115* (2013.01); *H05K 1/0243* (2013.01); *H05K 1/0248* (2013.01); *H05K 1/113* (2013.01);
(Continued)

(58) Field of Classification Search
CPC ............ H05K 1/00; H05K 1/02; H05K 1/147; H05K 1/181; H05K 1/228; H01L 21/50; H01L 23/00; H01L 23/52
(Continued)

(56) References Cited

U.S. PATENT DOCUMENTS 6,639,309 B2 * 10/2003 Wallace ........... G06K 19/07732
257/678
8,080,874 B1 * 12/2011 Werner ................. H01L 25/105
257/686

(Continued)

FOREIGN PATENT DOCUMENTS

TW          200610166 A       3/2006
TW          201533882 A       9/2015
WO     WO 2010071905 A1       7/2010

OTHER PUBLICATIONS

European Patent Office, Patent Search Report dated Oct. 23, 2018 regarding European patent application No. 18168724.5-1203.

*Primary Examiner* — Xiaoliang Chen
(74) *Attorney, Agent, or Firm* — Li & Cai Intellectual Property (USA) Office

(57) ABSTRACT

An electronic apparatus and a circuit board thereof are provided. The electronic apparatus operates in cooperation with a packaged electronic component. The electronic apparatus includes a circuit board and a control device disposed on the circuit board. The circuit board includes a plurality of conductive vias passing therethrough, and the conductive vias includes a plurality of first conductive vias arranged respectively corresponding to the first contact pads of the packaged electronic component. The control device includes a signal contact array including a plurality of first signal contacts. When the packaged electronic component and the control device are respectively disposed on two opposite sides of the circuit board, the packaged electronic component and the control device at least partially overlap in a thickness direction of the circuit board, and the first signal contacts are respectively electrically connected to the first contact pads via the corresponding conductive vias.

10 Claims, 6 Drawing Sheets

(51) Int. Cl.
H01L 21/50 (2006.01)
H01L 23/00 (2006.01)
H01L 23/52 (2006.01)
H05K 1/11 (2006.01)
H05K 1/18 (2006.01)
H05K 1/14 (2006.01)
H05K 3/34 (2006.01)

(52) U.S. Cl.
CPC ............. *H05K 1/144* (2013.01); *H05K 1/181* (2013.01); *H05K 1/114* (2013.01); *H05K 3/3436* (2013.01); *H05K 2201/09481* (2013.01); *H05K 2201/10159* (2013.01); *H05K 2201/10166* (2013.01); *H05K 2201/10545* (2013.01); *H05K 2201/10712* (2013.01); *H05K 2201/10734* (2013.01)

(58) Field of Classification Search
USPC ........ 361/772, 749, 783; 257/678, 712, 723, 257/773, 777; 365/149
See application file for complete search history.

(56) References Cited

U.S. PATENT DOCUMENTS

| | | | | |
|---|---|---|---|---|
| 9,201,097 | B1* | 12/2015 | Vodrahalli | G01R 1/07342 |
| 2003/0212853 | A1* | 11/2003 | Huppenthal | G06F 15/7867 |
| | | | | 711/104 |
| 2006/0012395 | A1* | 1/2006 | Huppenthal | G06F 15/7867 |
| | | | | 326/41 |
| 2007/0120250 | A1* | 5/2007 | Fairchild | H01L 23/3677 |
| | | | | 257/712 |
| 2007/0263425 | A1* | 11/2007 | Ruckerbauer | G11C 5/02 |
| | | | | 365/149 |
| 2009/0327565 | A1* | 12/2009 | Ware | G06F 13/4072 |
| | | | | 710/305 |
| 2010/0012934 | A1 | 1/2010 | Jung | |
| 2011/0007482 | A1* | 1/2011 | Takada | H05K 1/147 |
| | | | | 361/749 |
| 2011/0031628 | A1* | 2/2011 | Takada | G11C 5/04 |
| | | | | 257/773 |
| 2011/0247208 | A1* | 10/2011 | Ikeda | H01L 21/4857 |
| | | | | 29/830 |
| 2013/0193582 | A1* | 8/2013 | Choi | G11C 5/04 |
| | | | | 257/773 |
| 2013/0215588 | A1* | 8/2013 | Kawai | H05K 1/0298 |
| | | | | 361/783 |
| 2015/0125809 | A1* | 5/2015 | Pruckner | A61C 1/0069 |
| | | | | 433/27 |
| 2015/0318265 | A1* | 11/2015 | Isa | H01L 25/065 |
| | | | | 257/777 |
| 2017/0012023 | A1* | 1/2017 | Song | H01L 25/0657 |
| 2018/0045885 | A1* | 2/2018 | Canali | G02B 6/12002 |

* cited by examiner

ELECTRONIC APPARATUS, AND CIRCUIT BOARD AND CONTROL DEVICE THEREOF

BACKGROUND OF THE INVENTION

1. Field of the Invention

The present disclosure relates to an electronic apparatus, and a circuit board and a control device thereof; in particular, to an electronic apparatus, and a circuit board and a control device thereof with a simplified layout.

2. Description of Related Art

A conventional electronic apparatus usually includes a printed circuit board, an integrated circuit device, and at least one electronic component, in which the integrated circuit device and the electronic component are disposed at the same side of the printed circuit board and electrically connected to each other by a plurality of wiring layers of the printed circuit board.

Currently, the electrical contacts of some electronic components, such as a dynamic random access memory (DRAM), are defined according to a predetermined specification. Accordingly, the ball assignments of the integrated circuit device and the traces of the printed circuit board should be designed according to the specification of the electrical contacts of an electronic component. The number of the electrical contacts of an electrical component increases with higher requirements of the transmission speed and quality. On the other hand, the arrangement of the solder balls of the integrated circuit device and the layout of the printed circuit board for coordination with various types of the electronic components have become more dense and complex as the electronic apparatus becomes smaller in size.

However, the more dense and complex the circuit layout of the printed circuit board, the more easily the electronic apparatus is interfered by electromagnetic noise or crosstalk during the operation of the electronic apparatus. Furthermore, excessive length of a wire that is connected between the integrated circuit device and the electronic component would also result in higher signal transmission loss.

SUMMARY OF THE INVENTION

One of the objects of the present disclosure is simplifying the circuit layout of the circuit board of the electronic apparatus so as to reduce the crosstalk interference.

In order to achieve the aforementioned objects, according to an embodiment of the present disclosure, an electronic apparatus is provided. The electronic apparatus is adapted to operate in cooperation with a packaged electronic component that has a predetermined contact array. The predetermined contact array includes a plurality of first contact pads. The electronic apparatus includes a circuit board and a control device disposed on the circuit board. The circuit board includes a plurality of conductive vias passing therethrough, and the conductive vias includes a plurality of first conductive vias arranged respectively corresponding to the first contact pads. The control device is disposed on one side of the circuit board and includes a signal contact array, in which the signal contact array includes a plurality of first signal contacts. When the packaged electronic component is disposed on another side of the circuit board opposite to the control device, the packaged electronic component and the control device at least partially overlap in a thickness direction of the circuit board, and the first signal contacts are respectively electrically connected to the first contact pads through the corresponding conductive vias In order to achieve the aforementioned objects, according to an embodiment of the present disclosure, a circuit board for electrically connecting a control device to a packaged electronic component is provided. The control device and the packaged electronic component are disposed on the circuit board. The packaged electronic component includes a contact pad array which includes a plurality of first contact pads for forming a first contact pad pattern. The circuit board includes a first surface for supporting the control device, a second surface opposite to the first surface for supporting the package electronic device, and a plurality of conductive vias. A plurality of first conductive vias of the conductive vias located at a predetermined region of the circuit board passes through the circuit board and jointly forms a first pattern at the first surface and a second pattern at a second surface. The second pattern is a mirror-symmetric pattern of the first contact pad pattern.

In order to achieve the aforementioned objects, according to an embodiment of the present disclosure, a control device for operating together with a packaged electronic component and a circuit board is provided. The packaged electronic component includes a predetermined contact pad array having a plurality of first contact pads, and the circuit board including a plurality of conductive vias passing through the circuit board. The conductive vias includes a plurality of first conductive vias arranged corresponding to the first contact pads. The control device includes a signal contact array including a plurality of first signal contacts. When the control device is disposed on one side of the circuit board and the packaged electronic component is disposed on another side of the circuit board, the control device at least partially overlaps with the packaged electronic component in a thickness direction of the circuit board, and each of the first signal contacts is electrically connected to the corresponding one of the first contact pads through the corresponding one of the first conductive vias.

To sum up, in the electronic apparatus and the circuit board thereof in accordance with the present disclosure, conductive material formed by the signal contact array of the control device is a mirror-symmetric pattern of a part of the contact pad pattern formed by contact pad array of the packaged electronic component. As such, the circuit layout of the circuit board can be simplified to avoid the crosstalk resulting from too many wires or too high a wire density.

In order to further the understanding regarding the present disclosure, the following embodiments are provided along with illustrations to facilitate the disclosure of the present disclosure.

DETAILED DESCRIPTION OF THE PREFERRED EMBODIMENTS

Figure 1:
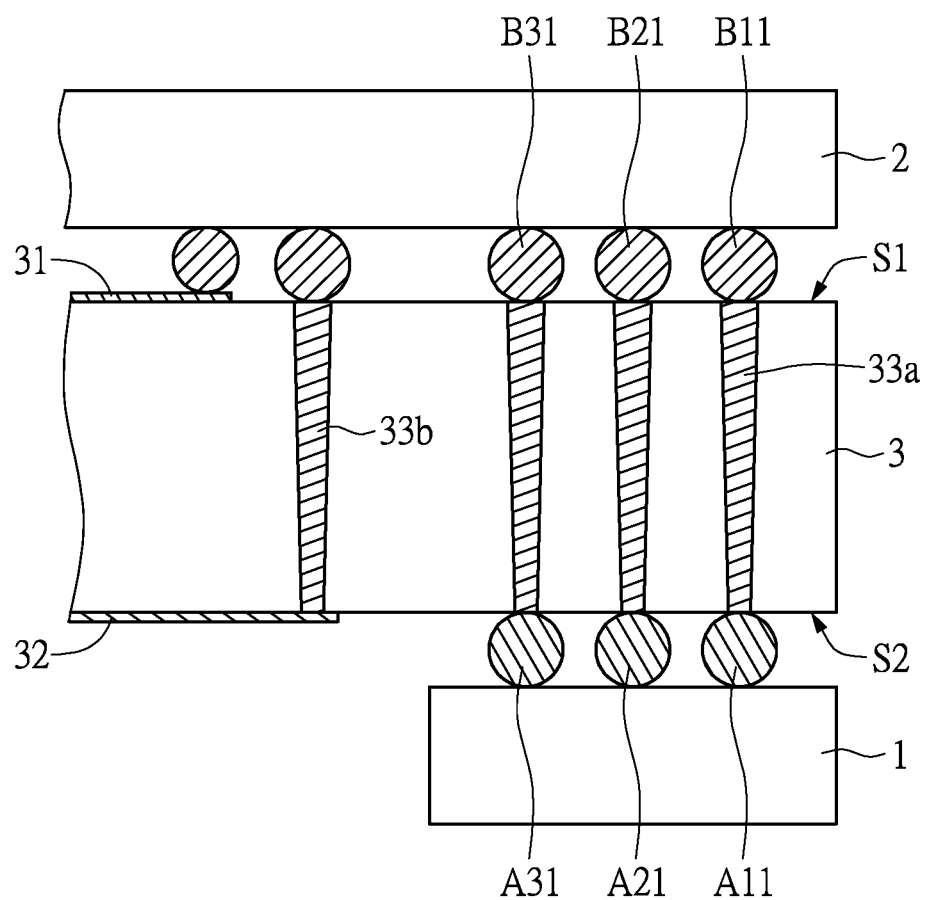
FIG. 1 is a sectional schematic view partially illustrating an electronic apparatus and a packaged electronic component in accordance with an embodiment of the present disclosure.

The aforementioned illustrations and following detailed descriptions are exemplary for the purpose of further explaining the scope of the present disclosure. Other objectives and advantages related to the present disclosure will be illustrated in the subsequent descriptions and appended drawings. In reference to the disclosure herein, for purposes of convenience and clarity only, directional terms, such as, top, bottom, left, right, up, down, over, above, below, beneath, rear, front, distal, and proximal are used with respect to the accompanying drawings. Such directional terms should not be construed to limit the scope of the invention in any manner. In addition, the same reference numerals are given to the same or similar components.

Figure 2:
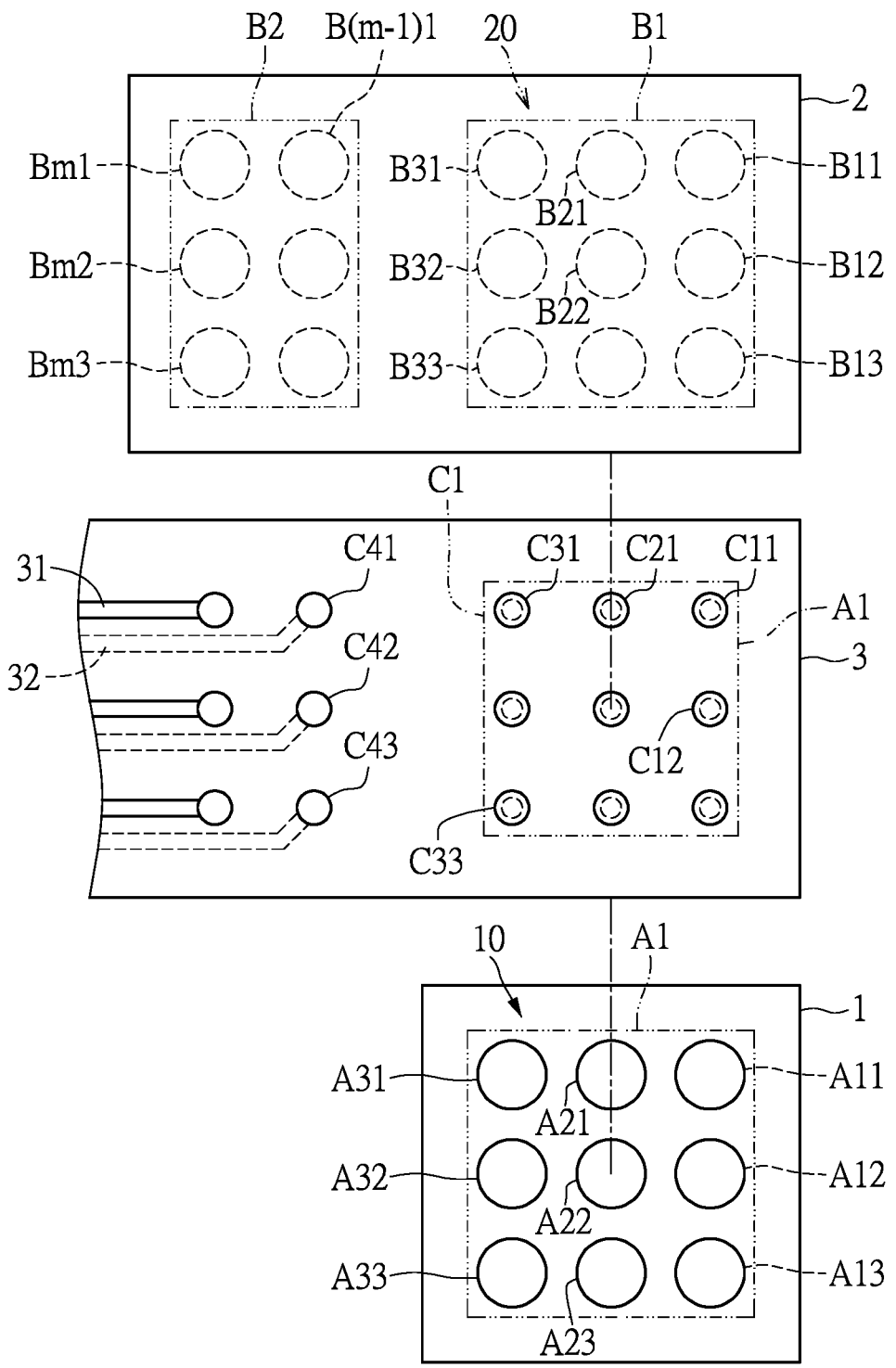
FIG. 2 is a top exploded schematic view partially illustrating the electronic apparatus and the packaged electronic component shown in FIG. 1.

Referring to FIG. 1 and FIG. 2, FIG. 1 is a sectional schematic view partially illustrating an electronic apparatus and a packaged electronic component in accordance with an embodiment of the present disclosure, and FIG. 2 is a top exploded schematic view partially illustrating the electronic apparatus and the packaged electronic component shown in FIG. 1.

The electronic apparatus operates in cooperation with the packaged electronic component 1. The packaged electronic component 1 can be a memory device or a network/modem integrated circuit. The memory device is, for example, a dynamic random access memory (DRAM), a read-only memory (ROM), or a flash memory. The network/modem integrated circuit can be a WiFi integrated circuit, a bluetooth integrated circuit or an LTE modem.

The packaged electronic component 1 usually has a contact pad array 10 that has a predetermined specification. That is to say, the contact pad array 10 includes a plurality of contact pads that respectively correspond to different signal contacts according to the predetermined specification, and the spaces between any two adjacent contact pads and the arrangements of the contact pads are defined according to the predetermined specification. It should be noted that the contact pad array 10 shown in FIG. 2 has been simplified to explain and clarify the concept of the present disclosure, and is not to be taken as the contact pad array in practical application.

As shown in FIG. 2, the contact pad array 10 of the present embodiment includes a plurality of first contact pads A11-A33. In the present embodiment, the contact pad array 10 is formed by a plurality of first contact pads A11-A33 arranged in m×n matrix configuration, in which "m" represents a number of the first contact pads arranged in a row, and "n" represents a number of the first contact pads arranged in a column. In the present embodiment, a 3×3 matrix is exemplified in the present disclosure.

As mentioned previously, the first contact pads A11-A33 have been defined as different signal terminals, such as a VCC pad, a VDD pad, a VSS pad, a power supply pad, a clock-signal pad, an address signal pad, and so on. Furthermore, the first contact pads A11-A33 are located in a first lower region A1 and jointly form a first contact pad pattern.

Furthermore, the electronic apparatus includes a circuit board 3 and a control device 2. As shown in FIG. 1, when the electronic apparatus operates in cooperation with the packaged electronic component 1, the control device 2 and the packaged electronic component 1 are respectively disposed at two opposite sides of the circuit board 3, and electrically connected to each other through the circuit board 3.

In other words, the control device 2 and the packaged electronic component 1 of the present embodiment are disposed on the circuit board 3 by using double-sided surface mount technology (SMT). In the embodiment of the present disclosure, the control device 2 and the packaged electronic component 1 at least partially overlap in a thickness direction of the circuit board 3 so as to minimize a length of each trace configured in the circuit board 3 and reduce a layout area thereof.

Furthermore, in the embodiment of the present disclosure, the layout of the circuit board 3 and the signal contacts of the control device 2 are designed according to the contact pad array 10 of the packaged electronic component 1.

Referring to FIG. 1, the circuit board 3 has a first surface S1 for being disposed with the control device 2, a second surface S2 which is opposite to the first surface S1 for being disposed with the packaged electronic component 1, and a plurality of conductive vias C11-C41 passing through the circuit board 3. That is, the conductive vias C11-C41 extend from the first surface S1 to the second surface S2. As shown in FIG. 2, the conductive vias C11-C33 which are located in a predetermined arrangement region C1 of the circuit board 3 are defined as first conductive vias. In the present embodiment, the predetermined arrangement region C1 corresponds to the first lower region A1 of the packaged electronic component 1 and the first upper region B1 of the control device 2. Accordingly, the first conductive vias C11-C33 are arranged respectively corresponding to the first contact pads A11-A33 of the packaged electronic component 1. To be more specific, the first conductive vias C11-C33 are arranged in a mirror-symmetrical manner relative to the first contact pads A11-A33.

Since the first contact pads A11-A33 of the packaged electronic component 1 are arranged in a 3×3 matrix configuration in the embodiment shown in FIG. 2, the first conductive vias C11-C33 are also arranged in a 3×3 matrix configuration so as to respectively correspond to the first contact pads A11-A33.

Referring to FIG. 1, the circuit board 3 further includes a plurality of conductive vias C11-C43. As shown in FIG. 1, each of the conductive vias C11-C33 includes a conductive material 33a, and the first conductive vias C11-C33 of the conductive vias C11-C43 respectively correspond to the first contact pads A11-A33.

Referring to FIG. 2, the control device 2 includes a signal contact array 20. The signal contact array 20 is formed by a plurality of signal contacts B11-Bmn arranged in m×n matrix configuration, in which "m" represents a number of the signal contacts arranged in a row and "n" represents a number of the signal contacts arranged in a column.

The signal contact array 20 includes a plurality of first signal contacts B11-B33 and a plurality of second signal contacts B(m−1)1-Bmn. In the present embodiment, only the first signal contacts B11-B33 of the signal contacts are respectively and electrically connected to the first conductive vias C11-C33, so that each of the first signal contacts B11-B33 can be electrically connected to each corresponding one of the first contact pads A11-A33.

As shown in FIG. 2, the plurality of the first signal contacts B11-B33 located in a first upper region B1 are arranged in a mirror-symmetrical manner relative to the arrangements of the first contact pads A11-A33. For example, the first contact pads A11-A33 are arranged in a 3×3 matrix configuration, and the first signal contacts B11-B33 are also arranged in a 3×3 matrix configuration so as to respectively correspond to the first contact pads A11-A33.

It should be noted that the phrase "the plurality of the first signal contacts B11-B33 are arranged in a mirror-symmetrical 'manner' relative to the arrangements of the first contact pads A11-A33" used in the present disclosure does not mean that each of the first signal contact must completely overlap with the corresponding one of the first contact pad. The condition of "mirror-symmetrical 'manner'" in the present disclosure is considered met as long as the orthogonal projection of each of the first signal contacts falls within the peripheral region of the corresponding one of the first contact pads. For example, the aforementioned peripheral region can be a circular area with a center located on the corresponding one of the first contact pads and a radius equal to a pitch between two adjacent first contact pads arranged along a diagonal line.

Referring to FIG. 1, when the control device 2 and the packaged electronic component 1 are respectively disposed on two opposite sides of the circuit board 3, the first upper region B1 of the control device 2 at least partially overlaps with the first lower region A1 of the packaged electronic component 1 in the thickness direction of the circuit board 3. As such, each of the first signal contacts B11-B33 arranged in the first upper region B1 can be electrically connected to the corresponding one of the first contact pads A11-A33 located in the first lower region A1 through the corresponding one of the first conductive vias C11-C33.

For example, referring to FIG. 1, the first signal contact B11 of the control device 2 is electrically connected to the first contact pad A11 of the packaged electronic component 1 by the conductive material 33a of one of the first conductive vias C11-C33.

Accordingly, the first signal contacts B11-B33 of the control device 2 and the first conductive vias C11-C33 of the circuit board 3 are arranged in conjunction with the arrangements of the first contact pad A11-A33 of the packaged electronic component 1. In one embodiment, a distance between any two adjacent first signal contacts B11-B33 is equal to a distance between any two adjacent first contact pads A11-A33. Similarly, the distance between any two adjacent first contact pads A11-A33 is also equal to a distance between any two adjacent first conductive vias C11-C33 so as to shorten the length of each trace connected between each of the first signal contacts B11-B33 and the corresponding one of the first contact pads A11-A33.

In other words, the first signal contacts B11-B33 of the control device 2 jointly form a first signal contact pattern in the first upper region B1, and the first contact pads A11-A33 of the packaged electronic component 1 jointly form a first contact pad pattern in the first lower region A1. The first signal contact pattern is a mirror-symmetric pattern of the first contact pad pattern.

Furthermore, in order to establish the electrical connection between the control device 2 and the packaged electronic component 1, the first conductive vias C11-C33 of the circuit board 3 jointly form a first pattern at the first surface S1 and a second pattern at the second surface S2. The first pattern is a mirror-symmetric pattern of the first signal contact pattern, and the second pattern is a mirror-symmetric pattern of the first contact pad pattern.

Accordingly, a horizontal distance between each of the first contact pads A11-A33 of the packaged electronic component 1 and the corresponding one of the first signal contacts B11-B33, and a horizontal distance between each of the first contact pads A11-A33 and the corresponding one of the first conductive vias C11-C33 are small enough so that the electrical connection can be established by the first conductive vias C11-C33 passing through the circuit board 3, thereby shortening the length of each trace configured in the circuit board 3. As such, not only can the layout design be simplified, but the signal transmission loss and the crosstalk can also be reduced due to the shorter trace length. Moreover, the layout area of the circuit board 3 can be reduced due to the shorter trace length, such that the size of the circuit board 3 or the dimension of the electronic apparatus can be further minimized.

It should be noted that in the embodiments of the present disclosure, the phrases "the first pattern is a mirror-symmetric pattern of the first signal contact pattern", and "the second pattern is a mirror-symmetric pattern of the first contact pad pattern" do not mean that the positions of each of the first conductive vias, the first signal contact and the first contact pad corresponding to one another must be in complete alignment. Specifically, as long as the offset distance between the first signal contact pattern and the first pattern is less than the distance between two diagonally adjacent first signal contacts B22, B11, and the offset distance between the first contact pad pattern and the second pattern is less than the distance between two diagonally adjacent first contact pads A22, A11, the purpose of the present disclosure can be achieved.

Similarly, the phrase "the first signal contact pattern is a mirror-symmetric pattern of the first contact pad pattern" does not mean each of first signal contact must be in alignment with the corresponding one of the first contact pads.

In other words, it is not necessary for the first signal contact pattern to be aligned with and completely overlap with the first contact pad pattern. In one embodiment, the first signal contact pattern can be offset from the first contact pad pattern. As long as the offset distance between the first signal contact pattern and the first contact pad pattern is less than two times the distance between two diagonally adjacent first signal contacts B22, B11, the purpose of the present disclosure can be achieved.

The first signal contact B11, the first conductive via C11 and the first contact pad A11, which are electrically connected to one another, are taken as an example in the present disclosure. At least two of the first signal contact B11, the first conductive via C11 and the first contact pad A11 can partially or completely overlap in a thickness direction of the circuit board 3.

Figure 3:
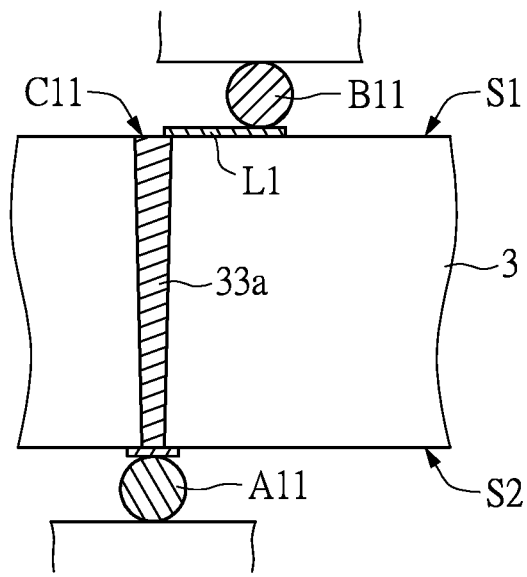
FIG. 3 is an enlarged schematic view partially illustrating the electronic apparatus and the packaged electronic component in accordance with another embodiment of the present disclosure.

Referring to FIG. 3, FIG. 3 is an enlarged schematic view partially illustrating the electronic apparatus and the packaged electronic component in accordance with another embodiment of the present disclosure. In the embodiment shown in FIG. 3, the first conductive via C11 partially or completely overlaps with the first contact pad A11 electrically connected thereto, while the first signal contact B11 does not overlap with the first contact pad A11 in the thickness direction of the circuit board 3.

Figure 4:
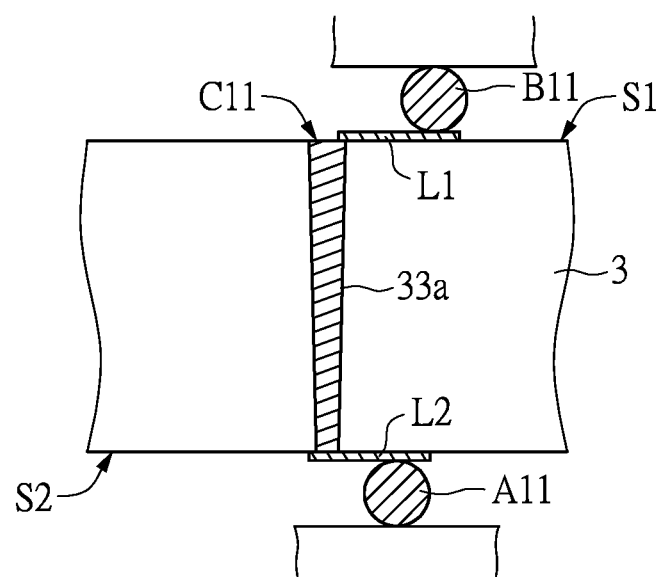
FIG. 4 is an enlarged schematic view partially illustrating the electronic apparatus and the packaged electronic component in accordance with another embodiment of the present disclosure.

Referring to FIG. 4, FIG. 4 is an enlarged schematic view partially illustrating the electronic apparatus and the packaged electronic component in accordance with another embodiment of the present disclosure. In the embodiment shown in FIG. 4, the first signal contact B11 and the first contact pad A11, which are electrically connected to each other, can partially or completely overlap, while the first conductive via C11 is disposed without overlapping with the first contact pad A11. In other words, the first signal contact B11 and the first contact pad A11 are mirror-symmetrically arranged to each other, but offset from the corresponding one of the first conductive via C11.

In another embodiment, the first signal contact B11, the first contact pad A11 and the first conductive via C11, which are electrically connected to one another, do not overlap in the thickness direction of the circuit board 3.

Figure 5:
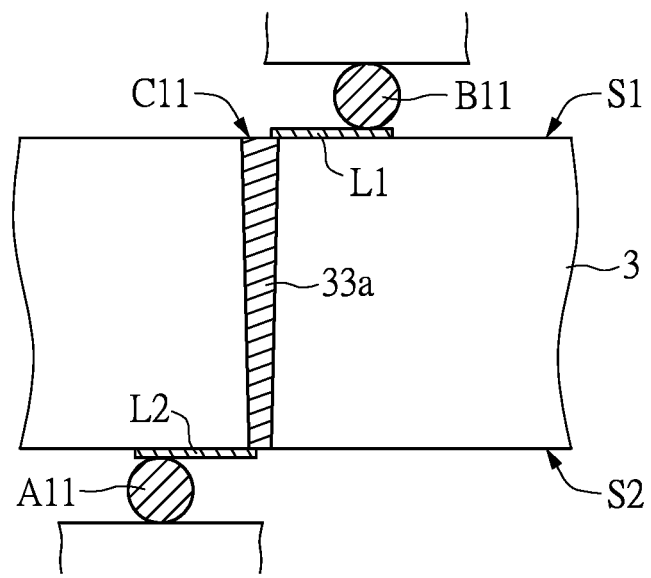
FIG. 5 is an enlarged schematic view partially illustrating the electronic apparatus and the packaged electronic component in accordance with another embodiment of the present disclosure.

Referring to FIG. 5, FIG. 5 is an enlarged schematic view partially illustrating the electronic apparatus and the packaged electronic component in accordance with another embodiment of the present disclosure. In the present embodiment, the first signal contact B11 and the first contact pad A11 are offset from the same first conductive via C11 in two different directions, and disposed without overlapping.

In the embodiments respectively shown in FIG. 3 to FIG. 5, the circuit board 3 further includes at least one of a conductive line L1 disposed on the first surface S1 and a conductive line L2 disposed on the second surface S2. Specifically, in the embodiment shown in FIG. 3, the first signal contact B11 is electrically connected to the corresponding one of the first conductive vias C11-C33 through the conductive line L1 so as to electrically connect the first contact pad A11. In the embodiments shown in FIG. 4 and FIG. 5, the first signal contact B11 and the first contact pad A11 are connected to the same first conductive via C11 respectively through the conductive line L1 disposed on the first surface S1 and the conductive line L2 disposed on the second surface S2, so that an electrical connection between the first signal contact B11 and the first contact pad A11 can be established.

However, compared to the conventional layout of the printed circuit board, in the embodiments respectively shown in FIGS. 3 to 5, each of the conductive lines L1, L2 has a shorter length, and the layout of the circuit board 3 is simpler. Accordingly, it is not necessary for each of the first signal contacts B11-B33 and the corresponding one of the first contact pads A11-A33 to be in alignment with each other in a vertical direction, that is to say, an offset tolerance in the vertical direction is allowed between each of the first signal contacts B11-B33 and the corresponding one of the first contact pads A11-A33 to achieve the purpose of the present disclosure.

Referring to FIG. 1 and FIG. 2, the signal contact array 20 of the control device 2 shown in FIG. 1 further includes a plurality of second signal contacts B(m−1)1-Bmn that are arranged in the second upper region B2. As shown in FIG. 1, in the present embodiment, the control device 2 and the packaged electronic component 1 are respectively disposed at two opposite sides of the circuit board 3, and the second upper region B2 does not overlap with the first lower region A1 in the thickness direction of the circuit board 3. In the present embodiment, the other conductive vias C41-C43 located outside of the predetermined arrangement region C1 are defined as second conductive vias, and each of second conductive vias C41-C43 includes conductive material 33b disposed in the circuit board 3.

Furthermore, the second signal contacts B(m−1)1-Bmn are electrically connected to another electronic component through the other conductive layers 31, 32 and the second conductive vias of the circuit board 3. That is to say, at least one of the second signal contacts B(m−1)1-Bmn is electrically insulated from the packaged electronic component 1, so that at least one of the second conductive vias C41-C43 is also electrically insulated from the packaged electronic component 1. However, according to the aforementioned embodiment, in another embodiment, the second signal contacts B(m−1)1-Bmn can be arranged in a mirror-symmetric manner relative to the arrangements of the contact pads of another electronic component.

Figure 6:
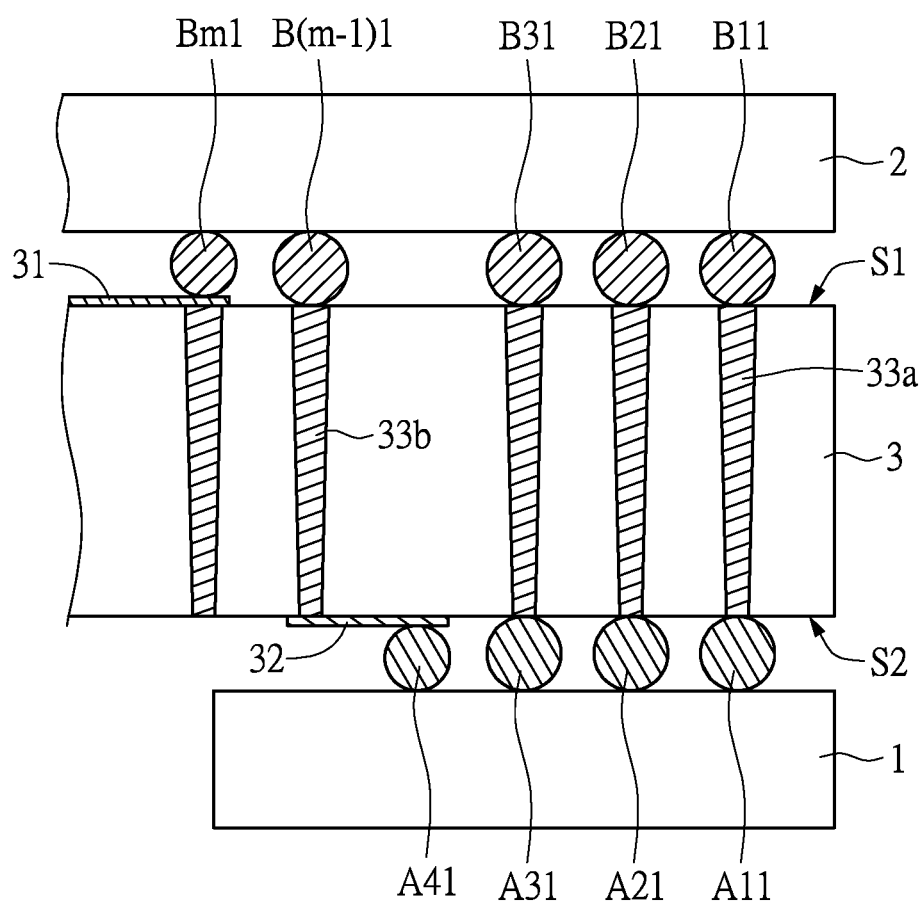
FIG. 6 is a sectional schematic view partially illustrating the electronic apparatus and the packaged electronic component in accordance with another embodiment of the present disclosure.
Figure 7:
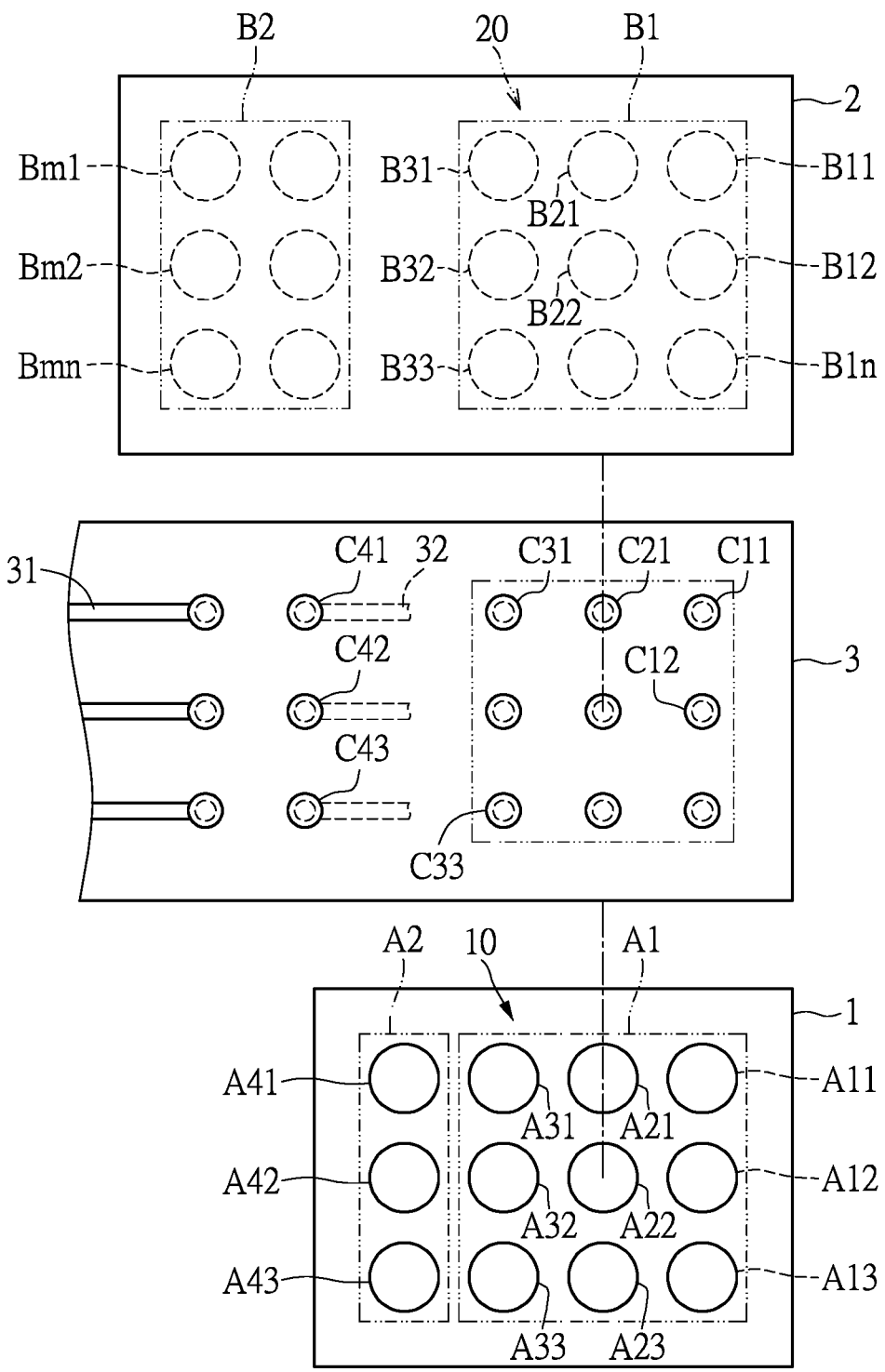
FIG. 7 is a top exploded schematic view partially illustrating the electronic apparatus and the packaged electronic component shown in FIG. 6.

Referring to FIG. 6 and FIG. 7, FIG. 6 is a sectional schematic view partially illustrating the electronic apparatus and the packaged electronic component in accordance with another embodiment of the present disclosure, and FIG. 7 is a top exploded schematic view partially illustrating the electronic apparatus and the packaged electronic component shown in FIG. 6.

As shown in FIG. 7, in the present embodiment, the contact pad array 10 of the packaged electronic component 1 further includes a plurality of second contact pads A41-A43 arranged in the second lower region A2.

In the present embodiment, the signal contact array 20 of the control device 2 partially corresponds to the contact pad array 10 of the packaged electronic component 1. Specifically, in the present embodiment, the first signal contacts B11-B33 in the first upper region B1 respectively correspond to the first contact pads A11-A33 in the first lower region A1, but do not correspond to the second contact pads A41-A43 in the second lower region A2.

Accordingly, the second contact pads A41-A43 are respectively electrically connected to the corresponding signal contacts, i.e., the second signal contacts B(m−1)1-B(m−1)3, of the control device 2 by the conductive layer 32 disposed on the circuit board 3.

In the present embodiment, the second upper region B2 does not overlap with the second lower region A2 in the thickness direction of the circuit board 3. Furthermore, at least one of the second signal contacts B(m−1)1-B(m−1)3 in the second upper region B2 is electrically connected to the corresponding one of the second contact pads A41-A43.

As shown in FIG. 6 and FIG. 7, each of the second signal contacts B(m−1)1-B(m−1)3 in the second upper region B2 are electrically connected to the corresponding one of the second contact pads A41-A43 in the second lower region A2 through the second conductive vias C41-C43 and the conductive layer 32 on the second surface S2.

In another embodiment, the second upper region B2 can overlap with the second lower region A2 in the thickness direction of the circuit board 3. That is to say, each of the signal contacts B11-Bmn of the signal contact array 20 and each of the contact pads A11-A43 of the contact pad array 10 are arranged in a mirror-symmetrical manner.

To sum up, in the electronic apparatus of the embodiment provided in the present disclosure, at least a part of the signal contact pattern formed by the signal contact array 20 of the control device 2 is a mirror-symmetric pattern of at least a part of the contact pad pattern formed by the contact pad array 10 of the packaged electronic component 1, such that the layout design can be simplified, thereby reducing the crosstalk that may result from too many wires or too great a wire density.

Furthermore, the circuit board 3 has a plurality of first conductive vias C11-C33 corresponding to the contact pad array 10 of the packaged electronic component 1, such that the control device 2 and the packaged electronic component 1 can be electrically connected to each other through the first conductive vias C11-C33.

Since each horizontal distance between each of the first contact pads A11-A33 of the packaged electronic component 1 and the corresponding one of the first signal contacts B11-B33, and each horizontal distance between one of the first contact pads A11-A33 and the corresponding one of the first conductive vias C11-C33 are small enough, the electrical connections between each of the first contact pads A11-A33 and the corresponding one of the first signal contacts B11-B33 can be established via the first conductive vias C11-C33 passing through the circuit board 3.

Accordingly, the length of each trace configured in the circuit board 3 can be shortened so that the trace layout configured in the circuit board 3 can be less complex and the signal transmission loss and crosstalk can be reduced. Furthermore, the layout area of the circuit board 3 can be reduced due to the shorter trace lengths, such that the size of the circuit board 3 can be further minimized.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. An electronic apparatus adapted to operate in cooperation with a packaged electronic component that has a predetermined contact pad array including a plurality of first contact pads positioned at a first lower region, wherein the electronic apparatus comprises:
    a circuit board including a plurality of conductive vias passing through the circuit board, wherein the conductive vias includes a plurality of first conductive vias arranged respectively corresponding to the first contact pads; and
    a control device disposed on one side of the circuit board and including a signal contact array, wherein the signal contact array includes a plurality first signal contacts positioned at a first upper region and a plurality of second signal contacts positioned at a second upper region;
    when the packaged electronic component is disposed on another side of the circuit board opposite to the control device, the packaged electronic component and the control device at least partially overlap in a thickness direction of the circuit board, the first upper region and the first lower region overlap in the thickness direction of the circuit board so that the first signal contacts are respectively electrically connected to the first contact pads by the corresponding first conductive vias;
    wherein the second upper region is disposed without overlapping with the first lower region in the thickness direction of the circuit board, and at least one of the second signal contacts is electrically connected to the packaged electronic component.

2. The electronic apparatus according to claim 1, wherein a distance between two adjacent first signal contacts is the same as that between two corresponding adjacent first contact pads.

3. The electronic apparatus according to claim 1, wherein at least two of the first signal contact, the first contact pad and the first conductive via which are electrically connected to one another partially overlap or completely overlap in the thickness direction of the circuit board.

4. The electronic apparatus according to claim 1, wherein the first signal contact, the first contact pad and the first conductive via which are electrically connected to one another are arranged without overlapping in the thickness direction of the circuit board.

5. The electronic apparatus according to claim 1, wherein the first signal contacts and the first contact pads are arranged in a mirror-symmetric manner.

6. The electronic apparatus according to claim 1, wherein the contact pad array includes a plurality of second contact pads positioned at a second lower region, the second lower region is disposed without overlapping with the second upper region in the thickness direction of the circuit board, and at least one of the second signal contacts is electrically connected to one of the second contact pads.

7. The electronic apparatus according to claim 1, wherein one of the first signal contact and one of the first contact pad that is electrically connected thereto at least partially overlap in the thickness of the circuit board and are offset from the corresponding one of the first conductive vias.

8. The electronic apparatus according to claim 1, wherein each of first signal contacts is offset from the corresponding one of the first conductive vias, and an offset distance between each of first signal contacts and the corresponding one of the first conductive vias is less than a distance between two diagonally adjacent first signal contacts.

9. The electronic apparatus according to claim 1, wherein each of the first conductive vias is offset from the corresponding one of the first contact pads, and an offset distance between each of the first conductive vias and the corresponding one of the first contact pads is less than a distance between two diagonally adjacent first contact pads.

10. A control device for operating together with a packaged electronic component and a circuit board, wherein the packaged electronic component includes a predetermined contact pad array having a plurality of first contact pads positioned at a first lower region, the circuit board includes a plurality of conductive vias passing through the circuit board, the conductive vias includes a plurality of first conductive vias arranged corresponding to the first contact pads, and the control device comprises:
    a signal contact array including a plurality of first signal contacts positioned at a first upper region and a plurality of second signal contacts positioned at a second upper region, wherein when the control device is disposed on one side of the circuit board and the packaged electronic component is disposed on another side of the circuit board, the control device at least partially overlaps with the packaged electronic component in a thickness direction of the circuit board, the first upper region and the first lower region overlap with each other in the thickness direction of the circuit board so that each of the first signal contacts is electrically connected to the corresponding one of the first contact pads via the corresponding one of the first conductive vias;
    wherein the second upper region is disposed without overlapping with the first lower region in the thickness direction of the circuit board, and at least one of the second signal contacts is electrically connected to the packaged electronic component.

* * * * *